(12) United States Patent
Kim et al.

(10) Patent No.: US 9,583,547 B2
(45) Date of Patent: Feb. 28, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Eun-Ho Kim, Yongin (KR); Mu-Hyun Kim, Yongin (KR); Su-Hwan Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 196 days.

(21) Appl. No.: 14/284,454

(22) Filed: May 22, 2014

(65) Prior Publication Data

US 2015/0200236 A1    Jul. 16, 2015

(30) Foreign Application Priority Data

Jan. 13, 2014  (KR) .................. 10-2014-0004059

(51) Int. Cl.
| | | |
|---|---|---|
| H01L 27/00 | (2006.01) | |
| H01L 27/32 | (2006.01) | |
| H01L 51/56 | (2006.01) | |
| H01L 51/52 | (2006.01) | |

(52) U.S. Cl.
CPC ............ *H01L 27/326* (2013.01); *H01L 27/32* (2013.01); *H01L 51/52* (2013.01); *H01L 51/56* (2013.01)

(58) Field of Classification Search
CPC ....... H01L 27/326; H01L 27/32; H01L 51/52; H01L 51/56
See application file for complete search history.

(56) References Cited

U.S. PATENT DOCUMENTS

| | | |
|---|---|---|
| 2011/0147770 A1 | 6/2011 | Hwang et al. |
| 2011/0164047 A1 | 7/2011 | Pance |
| 2012/0280894 A1 | 11/2012 | Park |
| 2012/0301986 A1 | 11/2012 | Choi et al. |
| 2013/0154910 A1* | 6/2013 | Chu ............... H01L 27/3218 345/83 |
| 2013/0162619 A1 | 6/2013 | Lee et al. |
| 2013/0329288 A1* | 12/2013 | Yim ............... H01L 51/5281 359/483.01 |

FOREIGN PATENT DOCUMENTS

| | | |
|---|---|---|
| KR | 10-2011-0071446 A | 6/2011 |
| KR | 10-2012-0101586 A | 9/2012 |
| KR | 10-2012-0124222 A | 11/2012 |
| KR | 10-2012-0131547 A | 12/2012 |
| KR | 10-2013-0075524 A | 7/2013 |

* cited by examiner

*Primary Examiner* — Caleb Henry
*Assistant Examiner* — Alexander Belousov
(74) *Attorney, Agent, or Firm* — Lee & Morse, P.C.

(57) ABSTRACT

An organic light-emitting display apparatus includes a plurality of pixels provided on a substrate, wherein each of the plurality of pixels includes: a first sub-pixel area for emitting light of a first color; a second sub-pixel area for emitting light of a second color different from the first color; a third sub-pixel area for emitting light of a third color different from the first and second colors; and a transmission area through which external light transmits, wherein the first through third sub-pixel areas and the transmission area are sequentially arranged on the substrate in a first direction.

9 Claims, 6 Drawing Sheets

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2014-0004059 filed on Jan. 13, 2014, in the Korean Intellectual Property Office, and entitled: "ORGANIC LIGHT-EMITTING DISPLAY APPARATUS AND METHOD OF MANUFACTURING THE SAME," is incorporated by reference herein in its entirety.

BACKGROUND

1. Field

One or more embodiments relate to an organic light-emitting display apparatus and a method of manufacturing the same.

2. Description of the Related Art

An organic light-emitting apparatus is a self-emitting display apparatus that includes an organic light-emitting device including a hole injection electrode, an electron injection electrode, and an organic emission layer formed therebetween. In the organic light-emitting apparatus, holes injected from the hole injection electrode and electrons injected from the electron injection electrode combine in the organic emission layer, thereby generating excitons, and when the excitons decay from an excited state to a ground state, light is emitted.

The organic light-emitting display apparatus does not use a separate light source. Therefore, the organic light-emitting display apparatus is driven with a low voltage and is light and thin. Also, as the organic light-emitting display apparatus has other excellent characteristics such as a broad viewing angle, high contrast, short response time, the application range of such an apparatus has been expanded from personal portable devices, such as MP3 players and portable terminals, televisions (TVs), etc.

SUMMARY

Embodiments are directed to an organic light-emitting display apparatus including a plurality of pixels provided on a substrate. Each of the plurality of pixels includes a first sub-pixel area that emits light of a first color, a second sub-pixel area that emits light of a second color different from the first color, a third sub-pixel area that emits light of a third color different from the first and second colors, and a transmission area through which external light transmits. The first through third sub-pixel areas and the transmission area are sequentially arranged on the substrate in a first direction.

A width of each of the first through third sub-pixel areas in the first direction may be smaller than a width thereof in a second direction that is substantially perpendicular to the first direction.

A width of the transmission area in the first direction may be greater than the width of each of the first through third sub-pixel areas in the first direction.

The widths of the first through third sub-pixel areas and the transmission area in the second direction may be substantially the same.

The first through third sub-pixel areas may respectively include first through third pixel electrodes and first through third intermediate layers that are respectively located on the first through third pixel electrodes. The organic light-emitting display apparatus may further includes a pixel defining layer that includes openings through which center portions of the first through third pixel electrodes are exposed and an opposing electrode commonly located on the first through third intermediate layers.

At least one of the pixel defining layer and the opposing electrode may include openings corresponding to the transmission area.

The first through third sub-pixel areas and the transmission areas that are included in the plurality of pixels may be respectively adjacent to each other in a second direction that is substantially perpendicular to the first direction.

The first through third intermediate layers may respectively include first through third organic light-emitting layers that emit light of the first through third colors and a common layer that is common to the first through third intermediate layers.

The first through third pixel electrodes may be reflective electrodes. The opposing electrode may be a transparent or semi-transparent electrode.

The first through third sub-pixel areas respectively include first through third circuit portions that are electrically connected to the first through third pixel electrodes, respectively. The first through third circuit portions may overlap with the first through third pixel electrodes in a plan view, respectively.

Embodiments are also directed to a method of manufacturing an organic light-emitting display apparatus that includes a plurality of pixels provided on a substrate, each of the plurality of pixels including a first sub-pixel area, a second sub-pixel area, a third sub-pixel area, and a transmission area that are sequentially arranged on the substrate in a first direction, the method including forming a first intermediate layer in the first sub-pixel area by using a first mask including first openings corresponding to the first sub-pixel area, forming a second intermediate layer in the second sub-pixel area by using a second mask including second openings corresponding to the second sub-pixel area, and forming a third intermediate layer in the third sub-pixel area by using a third mask including third openings corresponding to the third sub-pixel area.

The first through third masks may be smaller than the substrate in a second direction that is substantially perpendicular to the first direction.

Forming the first intermediate layer may include moving at least one of the substrate and the first mask in the second direction. Forming the second intermediate layer may include moving at least one of the substrate and the second mask in the second direction. Forming the third intermediate layer may include moving at least one of the substrate and the third mask in the second direction.

The first through third masks may respectively include a plurality of first openings, a plurality of second openings, and a plurality of third openings that correspond to the first through third sub-pixel areas that are included in the plurality of pixels that are arranged in the first direction.

Each of the first through third masks may include a blocking portion that at least partially corresponds to the transmission area.

The method may further include forming a common layer that is common to the first through third intermediate layers by using a common mask including fourth openings corresponding to the first through third sub-pixel areas.

The common mask may include a blocking portion corresponding to the transmission area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
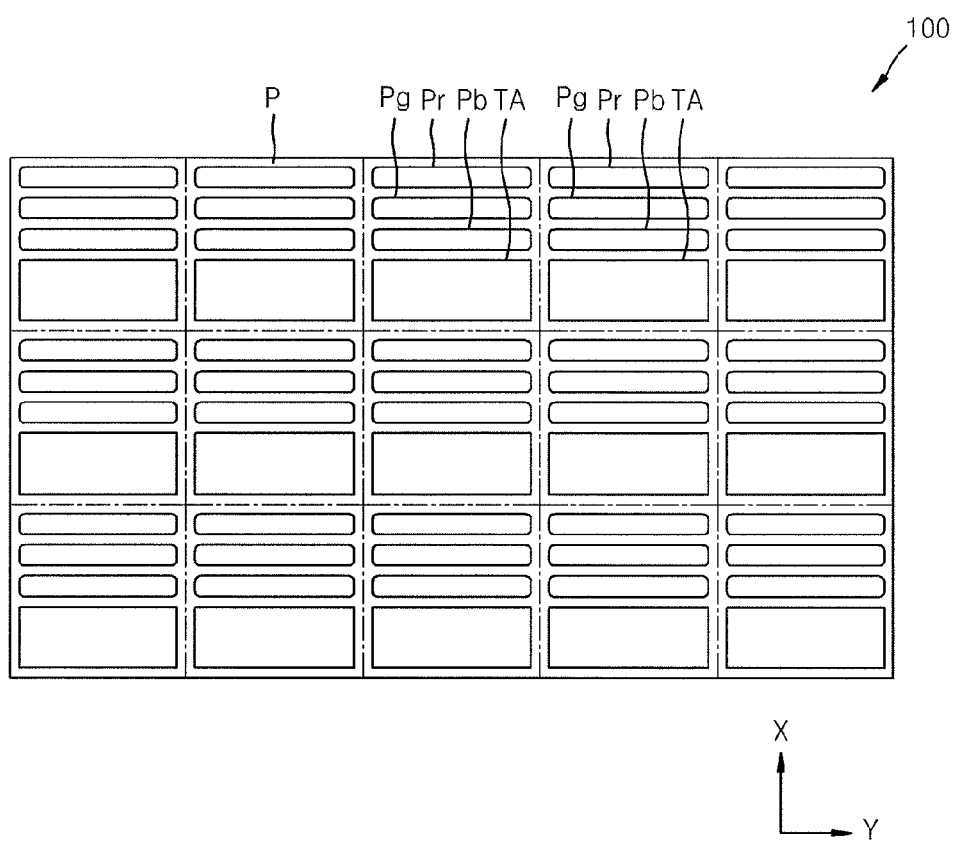
FIG. 1 illustrates a schematic plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

The effects and features will become apparent from the following description of the embodiments with reference to the accompanying drawings. The present invention may, however, may be embodied in different forms and should not be construed as being limited to the embodiments set forth herein.

Hereinafter, embodiments will be described in detail with reference to the accompanying drawings. In the present specification and drawings, like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 2:
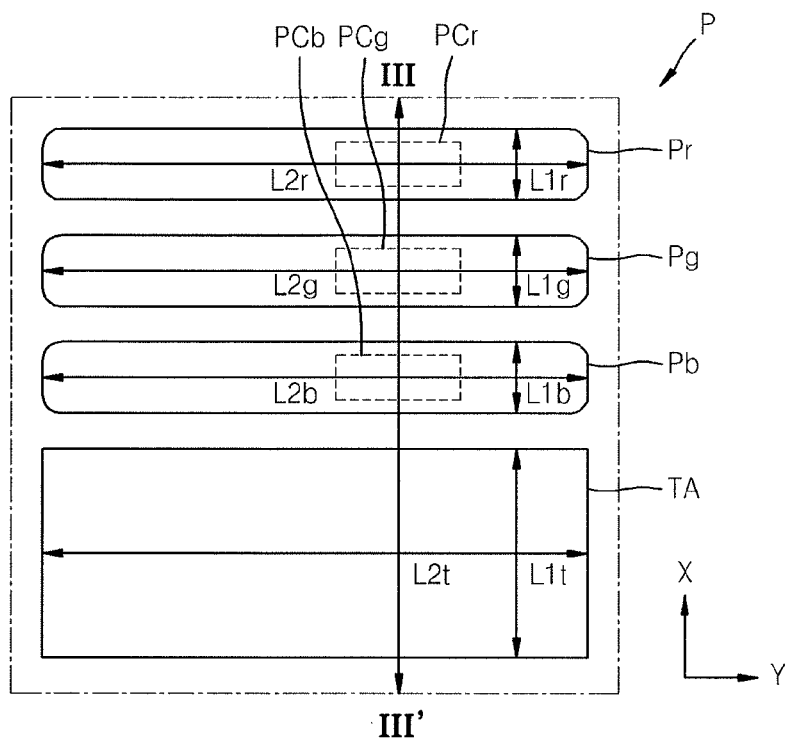
FIG. 2 illustrates a schematic plan view of a pixel included in the organic light-emitting display apparatus of FIG. 1.

FIG. 1 is a schematic plan view of an organic light-emitting display apparatus 100 according to an embodiment. FIG. 2 is a schematic plan view of a pixel P included in the organic light-emitting display apparatus 100 of FIG. 1.

Referring to FIGS. 1 and 2, the organic light-emitting display apparatus 100 may include a plurality of pixels P, each including a first sub-pixel Pr that emits light of a first color, a second sub-pixel area Pg that emits light of a second color different from the first color, a third sub-pixel area Pb that emits light of a third color different from the first and second colors, and a transmission area TA through which external light transmits, which are sequentially arranged in a first direction X.

The transmission area TA may be disposed to be adjacent to only the third sub-pixel area Pb, and the second sub-pixel area Pg and the third sub-pixel area Pb may be disposed between the first sub-pixel are Pr and the transmission area TA.

Figure 3:
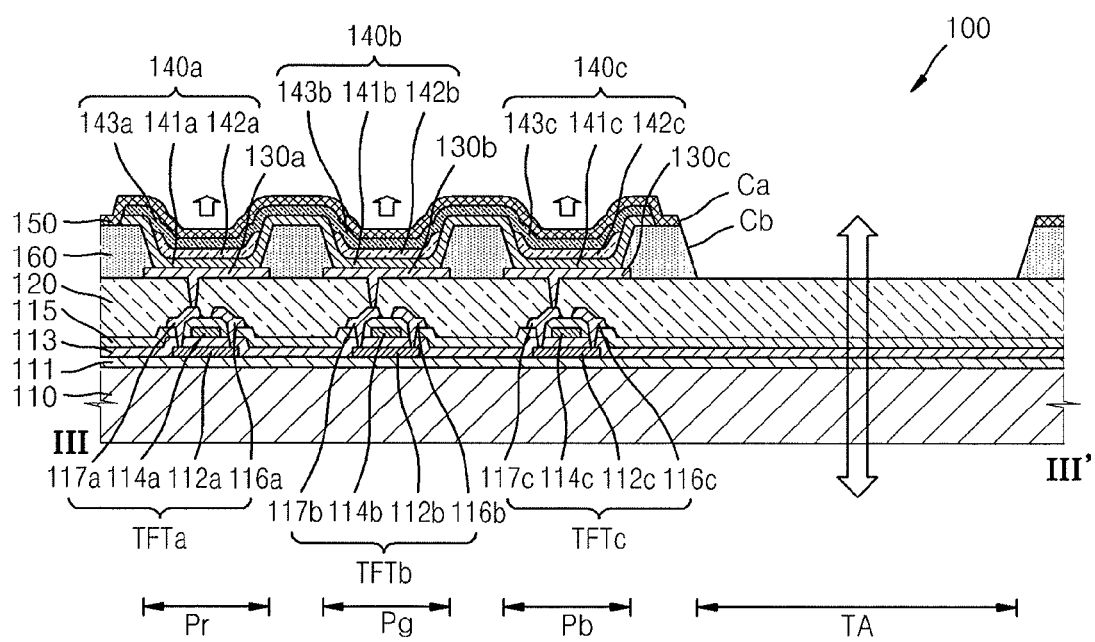
FIG. 3 illustrates a cross-sectional view taken along a line of FIG. 2.

The plurality of pixels P may be arranged in a matrix on a substrate (110 of FIG. 3). A predetermined number of pixels P may be disposed in the first direction X and a second direction Y according to the resolution of the display apparatus. The first direction X may be a short side direction of the organic light-emitting display apparatus 100 of FIG. 1. The second direction Y may be substantially perpendicular to the first direction X and may be a long side direction of the organic light-emitting display apparatus 100 of FIG. 1.

The first sub-pixel areas Pr that are included in the plurality of pixels P arranged in the second direction Y may be arranged to be adjacent to each other in the second direction Y. Likewise, the second sub-pixel areas Pg, the third sub-pixel areas Pb, and the transmission areas TA that are included in the plurality of pixels P may be arranged to be adjacent to each other in the second direction Y. The transmission area TA included in one pixel P may be disposed to be adjacent to the first sub-pixel area Pr of another pixel P disposed to be adjacent to the one pixel P in the first direction X.

Widths L1$r$, L1$g$, and L1$b$ of the first sub-pixel area Pr, the second sub-pixel areas Pg, and the third sub-pixel areas Pb, respectively, in the first direction X may be smaller than widths L2$r$, L2$g$, and L2$b$ in the second direction Y. The widths L2$r$, L2$g$, L2$b$, and L2$t$ of the first sub-pixel area Pr, the second sub-pixel areas Pg, the third sub-pixel areas Pb, and the transmission area TA, respectively, in the second direction Y may be substantially the same.

To secure a sufficient area of the transmission area TA, the transmission area TA may be disposed to be adjacent to a long side of the third sub-pixel area Pb. A side of the transmission area TA that is not adjacent to the third sub-pixel area Pb may be optionally adjusted according to sizes of the pixels P. To increase the transparency of the organic light-emitting display apparatus 100, a width L1t of the transmission area TA in the first direction X may be greater than the widths L1r, L1g, and L1b of the first sub-pixel area Pr, the second sub-pixel areas Pg, and the third sub-pixel areas Pb in the first direction X.

The first sub-pixel area Pr, the second sub-pixel areas Pg, and the third sub-pixel areas Pb may respectively emit light of the first through third colors that are different from each other. The first through third colors may be, for example, red, green, and blue. Any combinations of the first through third colors may be possible as long as the combinations may emit white light.

The first sub-pixel area Pr, the second sub-pixel areas Pg, and the third sub-pixel areas Pb may respectively include a first circuit portion PCr, a second circuit portion PCg, and a third circuit portion PCb. The first circuit portion PCr, the second circuit portion PCg, and the third circuit portion PCb may be provided to respectively overlap with first through third pixel electrodes (130a, 130b, and 130c of FIG. 3) in plan view.

FIG. 3 is a cross-sectional view taken along a line III-III' of FIG. 2.

Referring to FIG. 3, the organic light-emitting display apparatus 100 may include a substrate 110 divided into the first sub-pixel area Pr, the second sub-pixel areas Pg, the third sub-pixel area Pb, and the transmission area TA. The first through third pixel electrodes 130a, 130b, and 130c may be respectively disposed in the first sub-pixel area Pr, the second sub-pixel areas Pg, and the third sub-pixel areas Pb on the substrate 110. First through third intermediate layers 140a, 140b, and 140c may be respectively provided on the first through third pixel electrodes 130a, 130b, and 130c.

The first sub-pixel area Pr, the second sub-pixel areas Pg, and the third sub-pixel areas Pb may be defined by a pixel defining layer 160 including openings through which center portions of the first through third pixel electrodes 130a, 130b, and 130c are exposed. An opposing electrode 150 may be commonly provided on the first through third intermediate layers 140a, 140b, and 140c.

The transmission area TA through which external light transmits may be disposed in a region adjacent to the third sub-pixel area Pb. The opposing electrode 150 and the pixel defining layer 160 may respectively include openings Ca and Cb corresponding to the transmission area TA.

The first through third pixel electrodes 130a, 130b, and 130c may be reflective electrodes including reflective layers. For example, a reflective layer may include at least one selected from the group of silver (Ag), magnesium (Mg), aluminum (Al), platinum (Pt), palladium (Pd), gold (Au), nickel (Ni), neodymium (Nd), iridium (Ir), and chromium (Cr). A transparent or non-transparent electrode layer that is formed of at least one selected from the group of indium tin oxide (ITO), indium zinc oxide (IZO), zinc oxide (ZnO), indium oxide (In$_2$O$_3$), indium gallium oxide (IGO), and aluminum zinc oxide (AZO) may be further provided on the reflective layer.

For example, the first through third pixel electrodes 130a, 130b, and 130c may each be configured as three layers of ITO/Ag/ITO in which a thickness of the silver (Ag) layer is 1,000 Å or higher, thereby increasing reflectivity.

The first through third intermediate layers 140a, 140b, and 140c may respectively include first through third organic light-emitting layers 142a, 142b, and 142c that respectively emit light of first through third colors, and may further include a common layer that is common to the first through third intermediate layers 140a, 140b, and 140c.

The common layer may include first common layers 141a, 141b, and 141c that are disposed between the first through third pixel electrodes 130a, 130b, and 130c and the first through third organic light-emitting layers 142a, 142b, and 142c, and second common layers 143a, 143b, and 143c that are disposed between the opposing electrode 150 and the first through third organic light-emitting layers 142a, 142b, and 142c.

The first common layers 141a, 141b, and 141c may include a hole injection layer (HIL) and/or a hole transport layer (HTL). The second common layers 143a, 143b, and 143c may include an electron transport layer (ETL) and/or an electron injection layer (EIL).

The first through third intermediate layers 140a, 140b, and 140c may respectively include the first through third organic light-emitting layers 142a, 142b, and 142c and may further include various functional layers.

The first through third colors may be respectively red, green, and blue as examples. In other implementations, various color combinations other than the combination of the red, green and blue colors may be used, for example, various combinations that emit white light.

The opposing electrode 150 may be configured as a transparent or semi-transparent electrode, and may include one or more materials selected from silver (Ag), aluminum (Al), magnesium (Mg), lithium (Li), calcium (Ca), copper (Cu), LiF/Ca, LiF/Al, MgAg, and CaAg. The opposing electrode 150 may be formed as a thin film of several nm to several tens nm.

The light that is emitted from the first through third organic light-emitting layers 142a, 142b, and 142c including the first through third intermediate layers 140a, 140b, and 140c may be emitted toward the opposing electrode 150 directly or by being reflected by the first through third pixel electrodes 130a, 130b, and 130c. The organic light-emitting display apparatus 100 of the present embodiment may be a top-emission type apparatus.

The first sub-pixel area Pr, the second sub-pixel areas Pg, and the third sub-pixel areas Pb may respectively include the first circuit portion PCr, the second circuit portion PCg, and the third circuit portion PCb (of FIG. 2).

The first circuit portion PCr, the second circuit portion PCg, and the third circuit portion PCb may respectively include a first thin film transistor TFTa, a second thin film transistor TFTb, and a third thin film transistor TFTc that are electrically connected to the first through third pixel electrodes 130a, 130b, and 130c. The first circuit portion PCr, the second circuit portion PCg, and the third circuit portion PCb may be provided to respectively overlap with the first through third pixel electrodes 130a, 130b, and 130c in a plan view.

The first through third thin film transistors TFTa, TFTb, and TFTc may respectively include active layers 112a, 112b, and 112c, gate electrodes 114a, 114b, and 114c, source electrodes 116a, 116b, and 116c, and drain electrodes 117a, 117b, and 117c.

A first insulation layer 111 may be disposed between the substrate 110 and the active layers 112a, 112b, and 112c. A second insulation layer 113 may be disposed between the active layers 112a, 112b, and 112c and the gate electrodes 114a, 114b, and 114c. A third insulation layer 115 may be provided on the gate electrodes 114a, 114b, and 114c. A fourth insulation layer 120 may be provided on the source electrodes 116a, 116b, and 116c and the drain electrodes 117a, 117b, and 117c.

The first through fourth insulation layers 111, 113, 115, and 120 may be formed of materials through which light transmits. Thus the transmission area TA may have a high transparency with respect to external light.

The first circuit portion PCr, the second circuit portion PCg, and the third circuit portion PCb may be provided to respectively overlap with the first through third pixel electrodes 130a, 130b, and 130c. Thus, there may be no need to prepare a separate space for the first circuit portion PCr, the second circuit portion PCg, and the third circuit portion PCb, thereby facilitating to implement high resolution, and increasing transparency of the organic light-emitting display apparatus 100.

Figure 4:
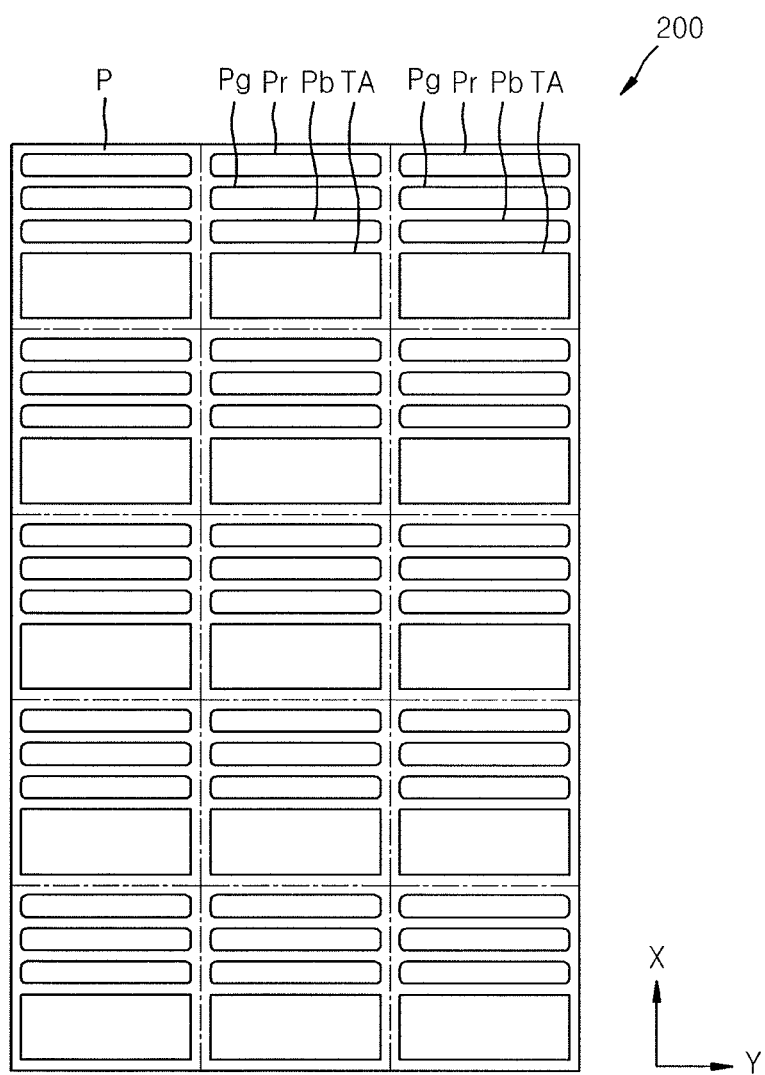
FIG. 4 illustrates a schematic plan view of an organic light-emitting display apparatus according to another embodiment.

FIG. 4 is a schematic plan view of an organic light-emitting display apparatus 200 according to another embodiment.

Referring to FIG. 4, the organic light-emitting display apparatus 200 according to another embodiment includes the plurality of pixels P each including the first sub-pixel are Pr that emits light of a first color, the second sub-pixel area Pg that emits light of a second color different from the first color, the third sub-pixel area Pb that emits light of a third color different from the first and second colors, and a transmission area TA through which external light transmits, which are sequentially arranged in the first direction X.

The organic light-emitting display apparatus 200 of FIG. 4 may be the same as the organic light-emitting display apparatus 100 of FIG. 1 except that the first direction X is a long side direction of the organic light-emitting display apparatus 200, and the second direction Y is a short side direction of the organic light-emitting display apparatus 200.

The first through third sub-pixel areas Pr, Pg, and Pb and the transmission area TA that are included in each of the pixels P may be sequentially arranged in the long side direction of the organic light-emitting display apparatus 200, and the first through third sub-pixel areas Pr, Pg, and Pb and the transmission areas TA that are included in the pixels P and arranged in the second direction Y, i.e. in the short side direction of the organic light-emitting display apparatus 200, may be disposed to be adjacent to each other.

According to the above-described configuration, an amount of time used to deposit intermediate layers on the organic light-emitting display apparatus 200 may be reduced, as will be described below.

Figure 5:
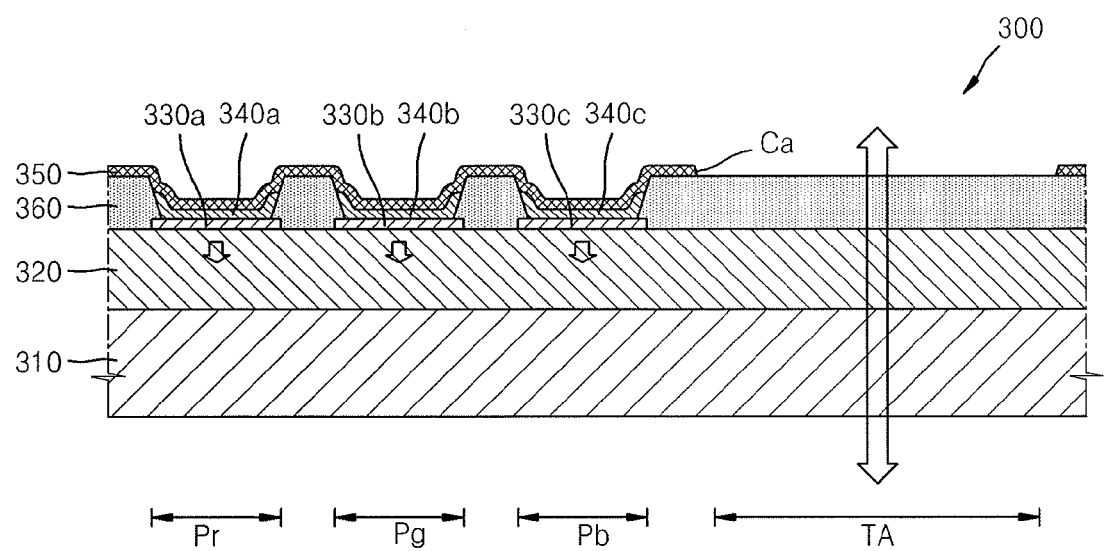
FIG. 5 illustrates a schematic cross-sectional view of an organic light-emitting display apparatus according to another embodiment.

FIG. 5 is a schematic cross-sectional view of an organic light-emitting display apparatus 300 according to another embodiment.

Referring to FIG. 5, the organic light-emitting display apparatus 300 according to another embodiment may include a substrate 310 divided into the first sub-pixel area Pr, the second sub-pixel areas Pg, the third sub-pixel areas Pb, and the transmission area TA. First through third pixel electrodes 330a, 330b, and 330c may be respectively disposed in the first sub-pixel area Pr, the second sub-pixel areas Pg, and the third sub-pixel areas Pb on the substrate 310. First through third intermediate layers 340a, 340b, and 340c may be respectively provided on the first through third pixel electrodes 330a, 330b, and 330c.

The first sub-pixel area Pr, the second sub-pixel areas Pg, and the third sub-pixel areas Pb may be defined by a pixel defining layer 360 including openings through which center portions of the first through third pixel electrodes 330a, 330b, and 340c are exposed. An opposing electrode 350 may be commonly provided on the first through third intermediate layers 340a, 340b, and 340c.

The transmission area TA through which external light transmits may be disposed in a region adjacent to the third sub-pixel area Pb. The opposing electrode 350 may include an opening Ca corresponding to the transmission area TA.

The first through third pixel electrodes 330a, 330b, and 330c may be transparent or semi-transparent electrodes, and may include at least one selected from the group of consisting of ITO, IZO, ZnO, $In_2O_3$, IGO, and AZO.

The first through third pixel electrodes 330a, 330b, and 330c may further include semi-transmissive layers for forming a microcavity along with the opposing electrode 350. A semi-transmissive layer may include at least one selected from the group consisting of Ag, Mg, Al, Pt, Pd, Au, Ni, Nd, Ir, Cr, Li, Ca, and Yb. The semi-transmissive layer may be formed as a thin film of several nm to several tens nm.

The first through third intermediate layers 340a, 340b, and 340c may include emission layers and may further include at least one of a HIL, a HTL, an ETL, and an EIL.

The opposing electrode 350 may be a reflective electrode and may include at least one selected from the group of Ag, Al, Mg, Li, Ca, Cu, LiF/Ca, LiF/Al, MgAg, and CaAg.

The first through third intermediate layers 340a, 340b, and 340c may emit light of red, green, or blue toward the substrate 310 directly or by reflecting the light by the opposing electrode 350 and transmitting the light the first through third pixel electrodes 330a, 330b, and 330c, which are transparent or semi-transparent electrodes.

The organic light-emitting display apparatus 300 according to the present embodiment may be a bottom-emission type apparatus that emits the light toward the substrate 310.

An insulation layer 320 may be disposed between the substrate 310 and the first through third pixel electrodes 330a, 330b, and 330c. Circuit portions for driving sub-pixels may be provided on the plane so as to not overlap with the first through third pixel electrodes 330a, 330b, and 330c in a plan view so that a path of the emitted light may not be interfered with.

The substrate 310, the insulation layer 320, and the pixel defining layer 360 may be formed of transparent materials, thereby increasing transparency of the external light in the transmission area TA.

Figure 6:
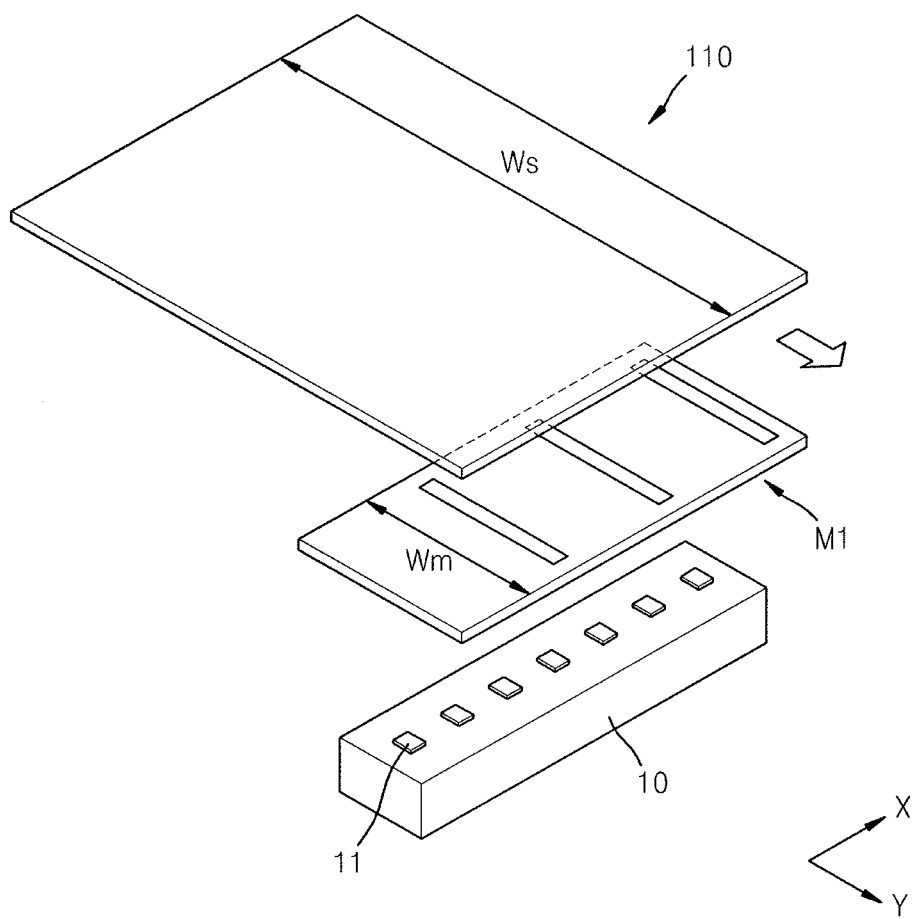
FIG. 6 illustrates a schematic conceptual diagram for explaining a method of manufacturing the organic light-emitting display apparatus of FIG. 1.
Figure 7:
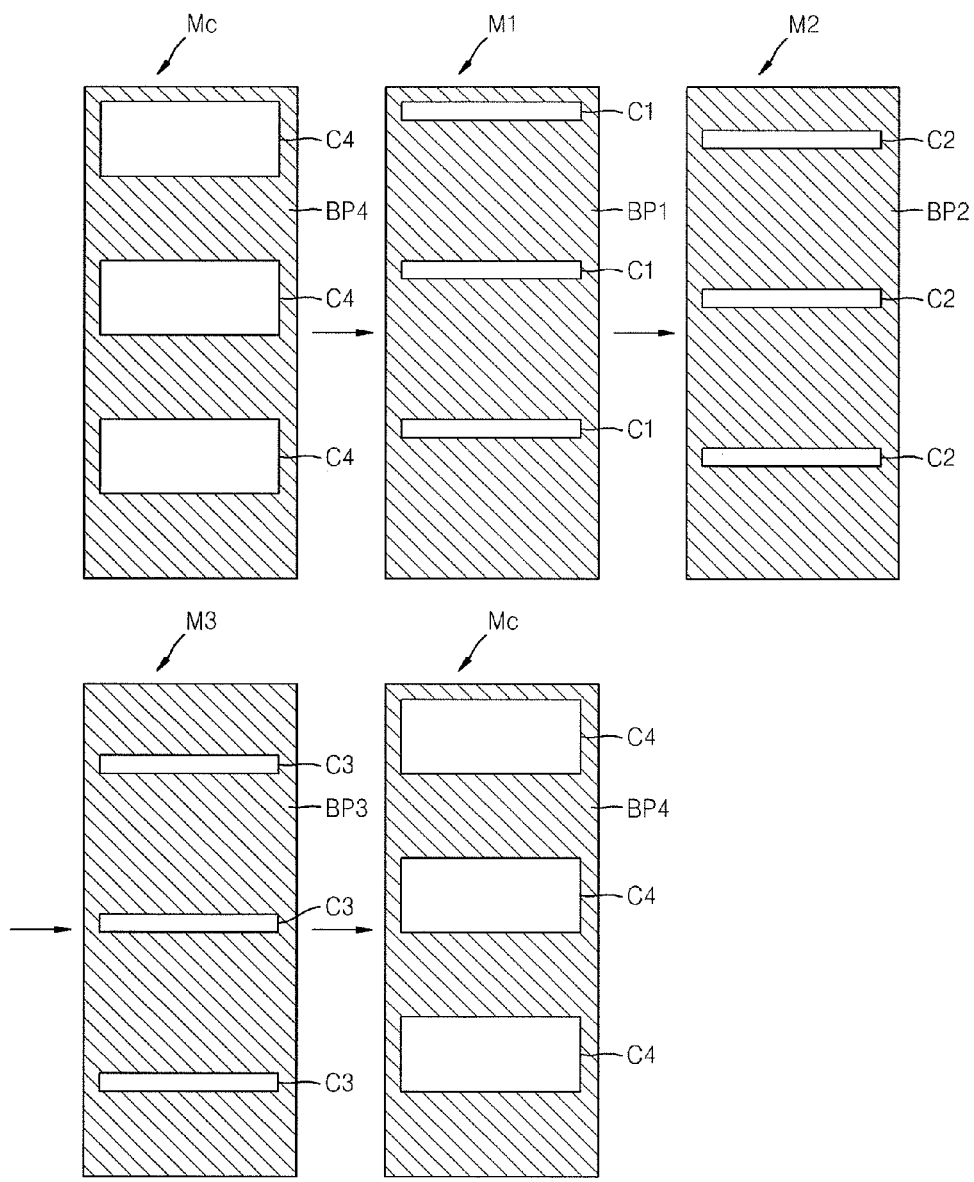
FIG. 7 illustrates a sequential plan view of masks used in the method of manufacturing the organic light-emitting display apparatus of FIG. 1.

FIG. 6 is a schematic conceptual diagram for explaining a method of manufacturing the organic light-emitting display apparatus 100 of FIG. 1. FIG. 7 is a sequential plan view of masks M1, M2, M3, and Mc used in the method of manufacturing the organic light-emitting display apparatus 100 of FIG. 1.

The method of manufacturing the organic light-emitting display apparatus 100 of FIG. 1 will now be described with reference to FIGS. 1, 3, 6, and 7 below.

FIG. 6 is a schematic diagram for explaining the method for forming the first through third intermediate layers 140a, 140b, and 140c in the first through third sub-pixel areas Pr, Pg, and Pb, respectively, as part of the method of manufacturing the organic light-emitting display apparatus 100 including the plurality of pixels P provided on the substrate 110, each pixel including the first sub-pixel area Pr, the second sub-pixel areas Pg, the third sub-pixel areas Pb, and the transmission area TA that are sequentially arranged in the first direction X.

The substrate 110 on which the first through third circuit portions PCr, PCg, and PCb, the first through third pixel electrodes 130a, 130b, and 130c, and the pixel defining layer 160 including openings Cb corresponding to the transmission area TA are formed is provided such that a surface of the substrate 110 to be deposited faces a deposition source 10. The first mask M1, the second mask M2, the third mask M3, or the common mask Mc may be disposed between the deposition source 10 and the substrate 110.

The deposition source 10 may include a plurality of nozzle portions 11 that may radiate deposition materials toward the substrate 110.

The first through third masks M1, M2, and M3 and the common mask Mc may be smaller than the substrate 110 with respect to the second direction Y. That is, a width Ws of the substrate 110 in the second direction Y may be greater than a width Wm of the first through third masks M1, M2, and M3 and the common mask Mc in the second direction Y.

Upon describing sequential processes of forming the first through third intermediate layers 140a, 140b, and 140c in the organic light-emitting display apparatus 100, the common mask Mc including fourth openings C4 corresponding to the first through third sub-pixels Pr, Pg, and Pb may be used to form the first common layers 141a, 141b, and 141c that are disposed between the first through third pixel electrodes 130a, 130b, and 130c and the first through third organic light-emitting layers 142a, 142b, and 142c such that the first common layers 141a, 141b, and 141c may be common to the first through third intermediate layers 140a, 140b, and 140c.

That is, materials for forming the first common layers 141a, 141b, and 141c may be radiated from the nozzle portions 11 and the substrate 110 may be moved in the second direction Y, such that the first common layers 141a, 141b, and 141c may be formed in the first through third sub-pixels Pr, Pg, and Pb included in the plurality of pixels P of the organic light-emitting display apparatus 100.

The first common layers 141a, 141b, and 141c may include a HIL and/or a HTL. The common mask Mc may include a blocking portion BP4 corresponding to the transmission area TA.

After the first common layers 141a, 141b, and 141c are formed, the first mask M1 including first openings C1 corresponding to the first sub-pixel area Pr may be used to form the first organic light-emitting layer 142a included in the first intermediate layer 140a in the first sub-pixel area Pr.

A material for forming the first organic light-emitting layer 142a that emits light of a first color may be radiated from the nozzle portions 11 and the substrate 110 may be moved in the second direction Y, so that the first organic light-emitting layer 142a may be formed in the first sub-pixels Pr included in the plurality of pixels P of the organic light-emitting display apparatus 100.

The first mask M1 may include the plurality of first openings C1 corresponding to the first sub-pixels Pr included in the plurality of pixels P that are arranged in the first direction X and the blocking portion BP1 that at least partially corresponds to the transmission area TA.

After the first organic light-emitting layer 142a is formed, the second mask M2 including second openings C2 corresponding to the second sub-pixel area Pg may be used to form the second organic light-emitting layer 142b included in the second intermediate layer 140b in the second sub-pixel area Pg.

A material for forming the second organic light-emitting layer 142b that emits light of a second color may be radiated from the nozzle portions 11 and the substrate 110 may be moved in the second direction Y, so that the second organic light-emitting layer 142b may be formed in the second sub-pixel area Pg included in the plurality of pixels P of the organic light-emitting display apparatus 100.

The second mask M2 may include the plurality of second openings C2 corresponding to the second sub-pixel area Pg included in the plurality of pixels P that are arranged in the first direction X and a blocking portion BP2 that at least partially corresponds to the transmission area TA.

After the second organic light-emitting layer 142b is formed, the third mask M3 including third openings C3 corresponding to the third sub-pixel area Pb may be used to form the third organic light-emitting layer 142c included in the third intermediate layer 140c in the third sub-pixel area Pb.

A material for forming the third organic light-emitting layer 142c that emits light of a third color may be radiated from the nozzle portions 11 and the substrate 110 may be moved in the second direction Y, so that the third organic light-emitting layer 142c may be formed in the third sub-pixel area Pb included in the plurality of pixels P of the organic light-emitting display apparatus 100.

The third mask M3 may include the plurality of third openings C3 corresponding to the third sub-pixel area Pb included in the plurality of pixels P that are arranged in the first direction X and a blocking portion BP3 that at least partially corresponds to the transmission area TA.

After the third organic light-emitting layer 142c is formed, the common mask Mc may be used to form the second common layers 143a, 143b, and 143c that are disposed between the opposing electrode 150 and the first through third organic light-emitting layers 142a, 142b, and 142c, so that the second common layers 143a, 143b, and 143c may be common to the first through third organic light-emitting layers 142a, 142b, and 142c.

Material for forming the second common layers 143a, 143b, and 143c may be radiated from the nozzle portions 11 and the substrate 110 may be moved in the second direction Y, so that the second common layers 143a, 143b, and 143c may be formed in the first through third sub-pixels Pr, Pg, and Pb included in the plurality of pixels P of the organic light-emitting display apparatus 100.

The second common layers 143a, 143b, and 143c may include the EIL and/or the ETL.

The method of manufacturing the organic light-emitting display apparatus 100 of the present embodiment describes moving the substrate 110 to the deposition source 10 and the first mask M1. In other implementations, the deposition source 10 and/or the first mask M1 may be moved to deposit onto the substrate 110 that is fixed.

At least one of operations of forming the first common layers 141a, 141b, and 141c and the second common layers 143a, 143b, and 143c may be omitted according to the configurations of the first through third intermediate layers 140a, 140b, and 140c.

The first through third masks M1, M2, and M3 and the common mask Mc may have the same sizes as that of the substrate 110 with respect to the first direction X, and may have the width Wm smaller than that of the substrate 110 with respect to the second direction Y. When the first through third masks M1, M2, and M3 and the common mask Mc are used to form the first through third intermediate layers 140a, 140b, and 140c included in the plurality of pixels P, the substrate 110 may be moved in the second direction Y to deposit the first through third intermediate layers 140a, 140b, and 140c.

A length of the organic light-emitting display apparatus 100 of FIG. 1 in the first direction X is smaller than the length of the organic light-emitting display apparatus 100 of FIG. 1 in the second direction Y. Thus, masks having relatively small sizes may be used to deposit the first through third intermediate layers 140*a*, 140*b*, and 140*c*, which may increase a moving distance of the substrate 110, thereby increasing a processing time and an amount of used deposition materials.

A length of the organic light-emitting display apparatus 200 of FIG. 4 in the first direction X is greater than that of the organic light-emitting display apparatus 200 of FIG. 4 in the second direction Y. Thus sizes of masks used may be larger, which may reduce a moving distance of a substrate to deposit intermediate layers, thereby reducing a processing time and an amount of used deposition materials.

The width Wm of the first mask M1 may be smaller than the width Ws of the substrate 110 in the second direction Y in FIGS. 6 and 7. In other implementations, the first through third masks M1, M2, and M3 and the common mask Mc may have the same sizes as the substrate 110 in the first and second directions X and Y.

In this case, the first mask M1 may be included in the plurality of pixels P, and may include slit type openings including the first sub-pixel areas Pr that are disposed to be adjacent to each other in the second direction Y. The second and third masks M2 and M3 and the common mask Mc may also have similar configurations to that of the first mask M1.

The organic light-emitting display apparatuses 100, 200, and 300 of the above-described embodiments use the first through third masks M1, M2, and M3 and the common mask Mc, which are slit type masks, to deposit intermediate layers. The transmission area TA is not disposed in an extension direction of slit type openings included in the first through third masks M1, M2, and M3 and the common mask Mc and/or in a moving direction of a substrate, i.e., the second direction Y, with respect to the first through third sub-pixel areas Pr, Pg, and Pb. Accordingly, no intermediate layer is deposited in the transmission area TA, thereby increasing the transparency of the organic light-emitting display apparatuses 100, 200, and 300.

Slit type masks having small alignment tolerance compared to dot type masks may be used to manufacture the organic light-emitting display apparatuses 100, 200, and 300, thereby increasing quality of the organic light-emitting display apparatuses 100, 200, and 300.

Masks having smaller sizes than that of a substrate may be used, and the substrate may be moved relative to the masks to deposit intermediate layers, thereby increasing a manufacturing yield of a large sized substrate and deposition efficiency.

As described above, one or more of the above embodiments provide an organic light-emitting display apparatus capable of depositing intermediate layers by using slit type masks having a small alignment tolerance and having a highly transparent pixel structure, and a method of manufacturing the organic light-emitting display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising a plurality of pixels provided on a substrate,
   each of the plurality of pixels including:
   a first sub-pixel area that emits light of a first color;
   a second sub-pixel area that emits light of a second color different from the first color;
   a third sub-pixel area that emits light of a third color different from the first and second colors; and
   a transmission area through which external light transmits,
   wherein the first through third sub-pixel areas and the transmission area are sequentially arranged on the substrate in a first direction, the first to third sub-pixel areas are separated from adjacent first to third sub-pixel areas along the first direction by a transmission area, and
   wherein the first through third sub-pixel areas and the transmission areas that are included in the plurality of pixels are respectively adjacent to each other in a second direction that is substantially perpendicular to the first direction.

2. The organic light-emitting display apparatus as claimed in claim 1, wherein a width of each of the first through third sub-pixel areas in the first direction is smaller than a width thereof in the second direction.

3. The organic light-emitting display apparatus as claimed in claim 2, wherein a width of the transmission area in the first direction is greater than the width of each of the first through third sub-pixel areas in the first direction.

4. The organic light-emitting display apparatus as claimed in claim 2, wherein the widths of the first through third sub-pixel areas and the transmission area in the second direction are substantially the same.

5. The organic light-emitting display apparatus as claimed in claim 1, wherein:
   the first through third sub-pixel areas respectively include first through third pixel electrodes, and first through third intermediate layers that are respectively located on the first through third pixel electrodes, and
   the organic light-emitting display apparatus further includes:
   a pixel defining layer including openings through which center portions of the first through third pixel electrodes are exposed; and
   an opposing electrode commonly located on the first through third intermediate layers.

6. The organic light-emitting display apparatus as claimed in claim 5, wherein at least one of the pixel defining layer and the opposing electrode includes openings corresponding to the transmission area.

7. The organic light-emitting display apparatus as claimed in claim 5, wherein the first through third intermediate layers respectively include first through third organic light-emitting layers that emit light of the first through third colors and a common layer that is common to the first through third intermediate layers.

8. The organic light-emitting display apparatus as claimed in claim 5, wherein:
   the first through third pixel electrodes are reflective electrodes, and
   the opposing electrode is a transparent or semi-transparent electrode.

9. The organic light-emitting display apparatus as claimed in claim 8, wherein:
- the first through third sub-pixel areas respectively include first through third circuit portions that are electrically connected to the first through third pixel electrodes, respectively, and
- the first through third circuit portions overlap with the first through third pixel electrodes in a plan view, respectively.

* * * * *